US005468922A

United States Patent [19]

Hanba

[11] Patent Number: 5,468,922

[45] Date of Patent: Nov. 21, 1995

[54] SUPPORTED VEHICLE ELECTROACOUSTICAL TRANSDUCING

[75] Inventor: Michio Hanba, Kawasaki, Japan

[73] Assignee: Bose Corporation, Framingham, Mass.

[21] Appl. No.: 954,572

[22] Filed: Sep. 30, 1992

[51] Int. Cl.[6] .................... H05K 5/00

[52] U.S. Cl. .................... 181/150; 181/156; 181/199

[58] Field of Search .................... 181/141, 145, 181/148, 150, 152, 153, 156, 199

[56] References Cited

U.S. PATENT DOCUMENTS

| | | | |
|---|---|---|---|
| Re. 31,679 | 9/1984 | Froeschle et al. | 181/156 X |
| 4,173,266 | 11/1979 | Pizer et al. | 181/156 |
| 4,567,959 | 2/1986 | Prophit | 181/156 |
| 4,650,031 | 5/1987 | Yamamoto | 181/156 |
| 4,752,326 | 2/1988 | Hutchins | 181/150 |
| 4,790,407 | 12/1988 | Yamamoto et al. | 181/141 |
| 4,924,962 | 5/1990 | Terai et al. | 181/141 |
| 4,928,788 | 5/1990 | Erickson | 181/141 |
| 5,150,417 | 9/1992 | Stahl | 181/156 X |

*Primary Examiner*—Khanh Dang
*Attorney, Agent, or Firm*—Fish & Richardson

[57] ABSTRACT

A loudspeaker enclosure for mounting on a vehicle rear deck includes a main chamber, and at least one subchamber adjacent to the main chamber. At least one support intercouples the main chamber and the at least one subchamber. The acoustic mass of the at least one subport and the acoustic compliance of the at least one subchamber establish a mass-compliance resonant frequency of the order of substantially 250 Hz.

15 Claims, 2 Drawing Sheets

SUPPORTED VEHICLE ELECTROACOUSTICAL TRANSDUCING

The present invention relates in general to vehicle electroacoustical transducing and more particularly concerns novel apparatus and techniques for reducing, by using a subported enclosure, the peak in response that typically characterizes a loudspeaker mounted on a rear deck.

For background, reference is made to U.S. Pat. No. 4,650,031 disclosing a loudspeaker having a duct of variable cross section coupling the inside of the enclosure to the outside to reduce port noise.

According to the invention, a ported loudspeaker enclosure includes at least one subchamber and subport characterized by a mass-compliance resonant frequency that corresponds substantially to the peak in response that characterizes a loudspeaker mounted on a vehicle rear deck. The mass is the acoustic mass of the subport, and the compliance is the acoustic compliance of the subchamber.

Other features, object and advantages of the invention will become apparent from the following detailed description when read in connection with the accompanying drawings in which.

Figure 1:
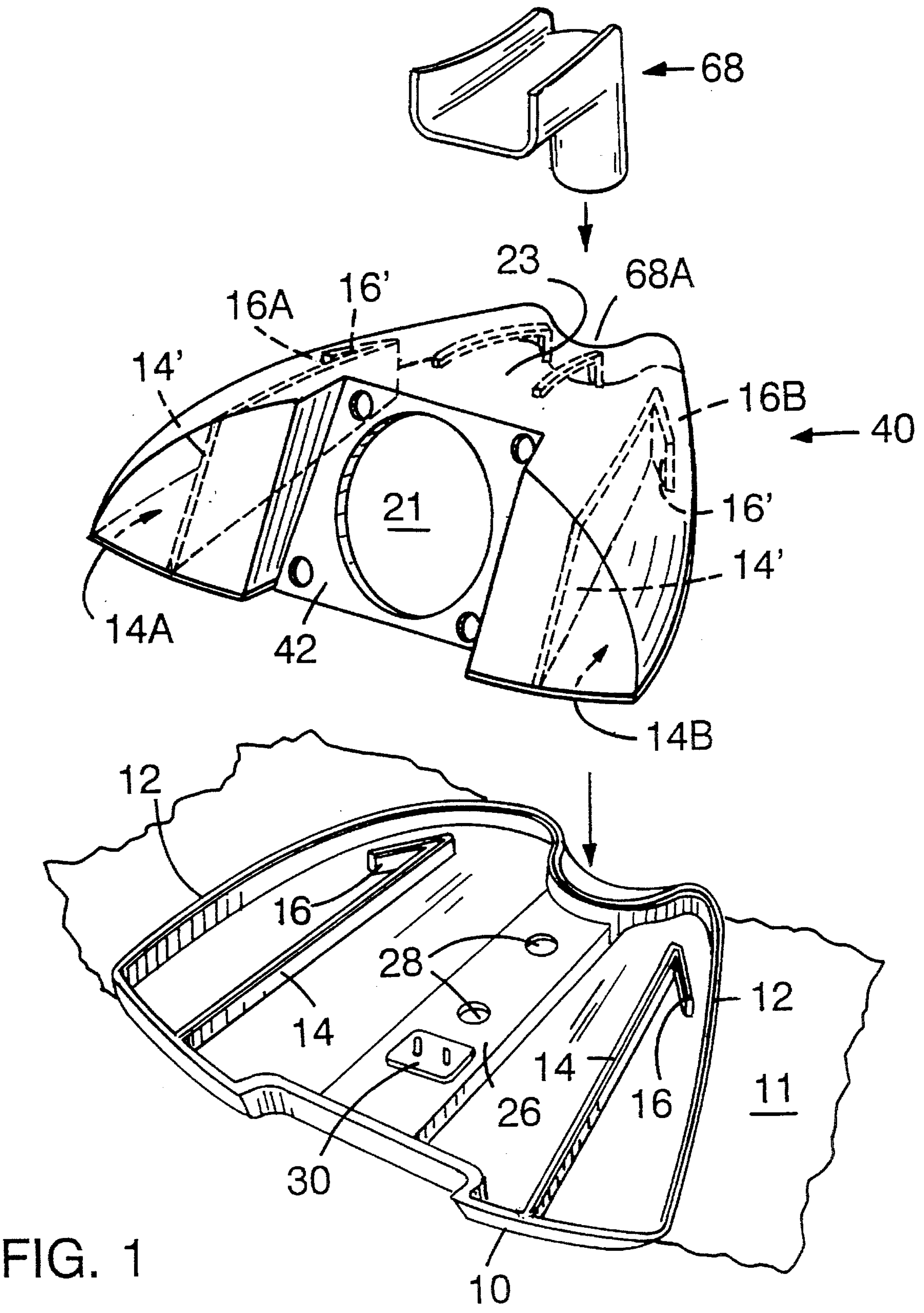
FIG. 1 is an exploded view of an exemplary embodiment of the invention for mounting on the rear deck of a vehicle.

With reference now to the drawing and more particularly FIG. 1 thereof, there is shown an exploded view of an enclosure according to the invention for mounting on a vehicle rear deck 11. The enclosure comprises a base 10, upper portion 40 and aerodynamic port cover 68.

Base 10 is formed with an upstanding rim 12, a pair of subchamber ridges 14 and subport ridges 16 that are coextensive with subchamber walls 14' and 16' to form subchambers 14A and 14B and subports 16A and 16B between respective subchambers and the central chamber 21 ported to the rear by aerodynamic port 23 formed by aerodynamic port cover 68 recessed inward at 68A to insure proper venting for the aerodynamic port when the enclosure is placed on a vehicle rear deck adjacent to the rear window.

Base 10 includes mounting holes 28 in central platform 26 for receiving T-nuts that secure the enclosure to rear deck 11. Platform 26 also carries terminals 30 connected to the loudspeaker driver.

Figure 2:
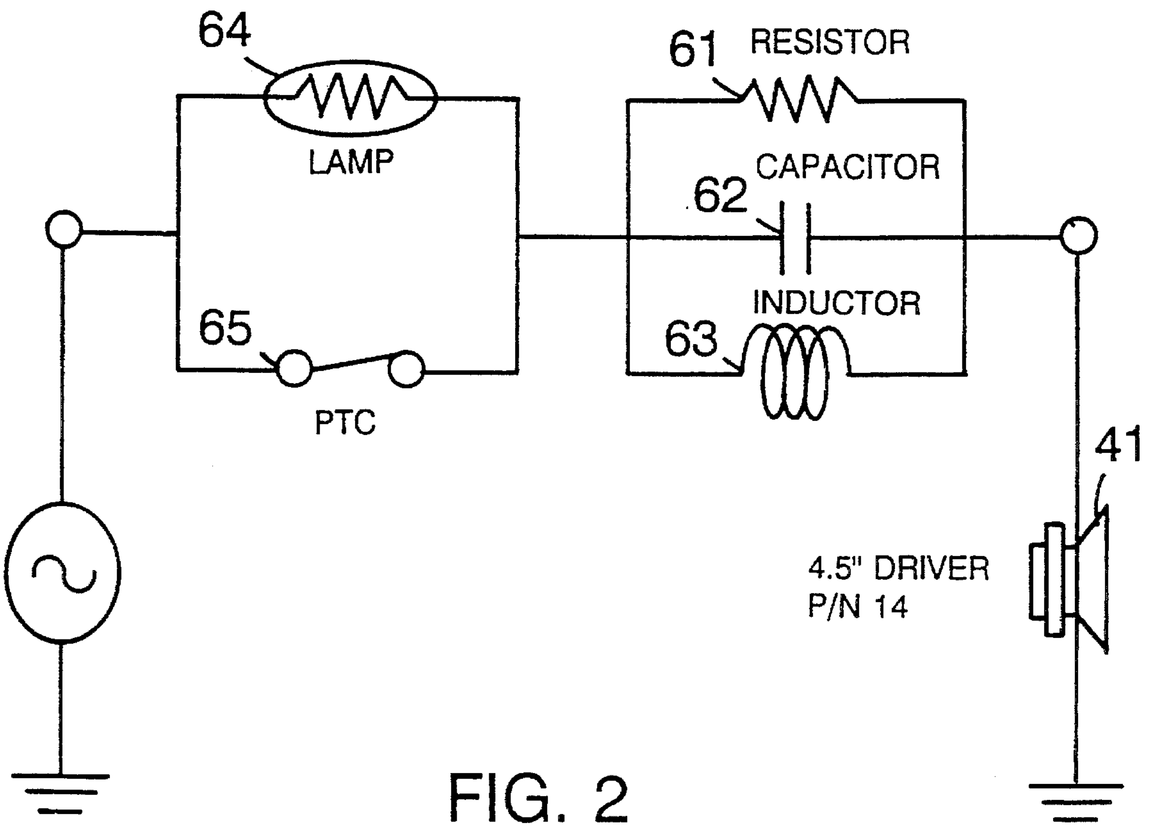
FIG. 2 is a schematic circuit diagram of a loudspeaker system embodying the invention.

Referring to FIG. 2, there is shown a schematic circuit diagram of the electrical circuitry. Loudspeaker driver 41 mounted on driver mounting panel 42 (FIG. 1) receives energy through a passive equalizer circuit comprising resistor 61, capacitor 62 and inductor 63 and through a power limiting circuit comprising lamp 64 and positive temperature coefficient ("PTC") device 65 that opens when the current exceeds a predetermined value to allow lamp 64 to limit current. Driver 41 is typically a 4.5" full-range helical voice coil driver commercially available from Bose Corporation. Typical values for resistor 61, capacitor 62 and inductor 63 are 7.5 ohms, 4.7 microfarads and 0.5 mh, respectively.

It is known that a loudspeaker driver mounted on a rear deck has a peak introduced substantially at 250 Hz. By establishing the subport-subchamber resonance at substantially 250 Hz determined by the cross-sectional area and length of each subport and the volume of each subchamber, the invention compensates for this peak so that the overall response in the region of 250 Hz is substantially uniform when mounted on a vehicle rear deck.

In the exemplary embodiment the volume of each subchamber is 0.4 liters, the length of each subport is 5.5 centimeters, the cross sectional area of each subport is 5.1 centimeters squared, and the volume of the main chamber is 2.0 liters. The aerodynamic subport is made substantially in accordance with the techniques in the aforesaid patent. The recess at the rear insures proper ventilation for the aerodynamic port.

Other embodiments are within the claims.

What is claimed is:

1. A loudspeaker enclosure for mounting on the rear deck of a vehicle comprising, a main chamber having a loudspeaker driver mounting panel, at least one subchamber adjacent to said main chamber, and at least one subport intercoupling said main chamber and said at least one subchamber, said at least one subport characterized by acoustic mass and said at last one subchamber characterized by acoustic compliance with the acoustic mass of said at least one subport and the acoustic compliance of said at least one subchamber establishing a mass-compliance resonant frequency of the order of 250 Hz.

2. A loudspeaker enclosure in accordance with claim 1 wherein said enclosure includes at least a second subchamber adjacent to said main chamber and at least a second subport with said main chamber separating the at least one subchamber and the at least a second subchamber.

3. A loudspeaker enclosure in accordance with claim 1 and further comprising, a loudspeaker driver mounted on said driver mounting panel inside said main chamber.

4. A loudspeaker enclosure in accordance with claim 2 and further comprising, a loudspeaker driver mounted on said driver mounting panel inside said main chamber.

5. A loudspeaker enclosure in accordance with claim 3 and additional apparatus comprising, a vehicle rear deck, said enclosure being mounted upon said vehicle rear deck.

6. A loudspeaker enclosure in accordance with claim 4 and additional apparatus comprising, a vehicle rear deck, said enclosure being mounted upon said vehicle rear deck.

7. A loudspeaker enclosure in accordance with claim 1 and further comprising, a port intercoupling said main chamber and the exterior of said enclosure, said enclosure having a back portion, said port being located at the back portion of said enclosure, and said port being recessed inward toward the interior of said enclosure to insure proper venting for said port when said enclosure is placed on a vehicle rear deck adjacent to a rear window of said vehicle.

8. A loudspeaker enclosure in accordance with claim 3 and further comprising, a port intercoupling said main chamber and the exterior of said enclosure, said enclosure having a back portion, said port being located at the back portion of said enclosure, and said port being recessed inward toward the interior of said enclosure to insure proper venting for said port when said enclosure is placed on a vehicle rear deck adjacent to a rear window of said vehicle.

9. A loudspeaker enclosure in accordance with claim 5 and further comprising, a port intercoupling said main chamber and the exterior of said enclosure, said enclosure having a back portion, said port being located at the back portion of said enclosure, and said port being recessed inward toward the interior of said enclosure to insure proper venting for said port when said enclosure is placed on a vehicle rear deck adjacent to a rear window of said vehicle.

10. A loudspeaker enclosure in accordance with claim 1 and further comprising, a port intercoupling said main chamber and the exterior of said enclosure.

11. A loudspeaker enclosure in accordance with claim 2 and further comprising, a port intercoupling said main chamber and the exterior of said enclosure.

12. A loudspeaker enclosure in accordance with claim 3 and further comprising, a port intercoupling said main chamber and the exterior of said enclosure.

13. A loudspeaker enclosure in accordance with claim 4 and further comprising, a port intercoupling said main chamber and the exterior of said enclosure.

14. A loudspeaker enclosure in accordance with claim 5 and further comprising, a port intercoupling said main chamber and the exterior of said enclosure.

15. A loudspeaker enclosure in accordance with claim 6 and further comprising, a port intercoupling said main chamber and the exterior of said enclosure.

* * * * *

UNITED STATES PATENT AND TRADEMARK OFFICE
CERTIFICATE OF CORRECTION

PATENT NO. : 5,468,922

DATED : November 21, 1995

INVENTOR(S) : Michio Hanba

It is certified that error appears in the above-identified patent and that said Letters Patent is hereby corrected as shown below:

Cover Page, in the title, "SUPPORTED" should read --SUBPORTED--.

In the ABSTRACT, line 3, "support" should read --subport--.

Column 1, in the title, "SUPPORTED" should read --SUBPORTED--.

Signed and Sealed this

First Day of October, 1996

Attest:

BRUCE LEHMAN

Attesting Officer

Commissioner of Patents and Trademarks